United States Patent [19]

Hamilton

[11] Patent Number: 5,415,749
[45] Date of Patent: May 16, 1995

[54] PROCESS FOR ELECTRODEPOSITION OF RESIST FORMULATIONS WHICH CONTAIN METAL SALTS OF β-DIKETONES

[75] Inventor: William L. Hamilton, Chesapeake City, Md.

[73] Assignee: E. I. Du Pont de Nemours and Company, Wilmington, Del.

[21] Appl. No.: 205,441

[22] Filed: Mar. 4, 1994

[51] Int. Cl.$^6$ ............................................. C25D 13/10
[52] U.S. Cl. ............................. 204/181.6; 204/180.6; 430/287; 430/270
[58] Field of Search .................... 204/181.6, 180.6; 430/287, 270

[56] References Cited

U.S. PATENT DOCUMENTS

| | | | |
|---|---|---|---|
| 4,455,364 | 6/1984 | Sasa | 430/299 |
| 4,845,012 | 6/1989 | Seko et al. | 204/181.6 |
| 4,943,513 | 7/1990 | Lipson et al. | 430/270 |
| 5,344,740 | 9/1994 | Iwasawa et al. | 430/271 |

*Primary Examiner*—John Niebling
*Assistant Examiner*—Kishor Mayekar

[57] ABSTRACT

A process for electrodepositing a coating on an electroconductive article employed as an anode by immersing the electroconductive article in a photoimageable electrodeposition coating composition comprising an aqueous dispersion of (a) a water-soluble or water-dispersible polymer having an acid value of 20 to 300, and a number average molecular weight of not less than 300 with the proviso that when the polymer is unsaturated, it has an unsaturated equivalent of 150 to 3000, and when the polymer is saturated it is used in combination with an ethylenically unsaturated compound; (b) an initiator or initiating system, and (c) a defined metal salt of a β diketone.

19 Claims, No Drawings

PROCESS FOR ELECTRODEPOSITION OF RESIST FORMULATIONS WHICH CONTAIN METAL SALTS OF β-DIKETONES

FIELD OF THE INVENTION

This invention relates to a method for electrodepositing a coating on an electroconductive article. More specifically, the invention relates to a method for electrodepositing a photoresist coating on a printed wiring board.

BACKGROUND OF THE INVENTION

The invention is directed to the field of liquid-type photoresists and the method of electrophoresis for depositing such films on conductive surfaces. Electrophoresis refers to the motion of charged particles or molecules through a liquid medium under the influence of an applied electric field. Electrophoretic deposition or electrodeposition is conducted in an electrolytic cell where the surfaces of the conductive material, to be coated with the migrating charged particles, serves as one electrode. The electrodeposition of cationic polymers (positively charged polymers) on the surface of a negatively charged electrode (cathode) is referred to as cataphoresis, while the electrophoretic deposition of anionic polymers (negatively charged polymers) on the surface of a positively charged electrode (anode) is referred to anaphoresis.

Coating metal objects by electrophoresis is well known and widely used to paint metal surfaces such as automobiles. Electrophoresis has been used to prepare electrical components, such as resistors and capacitors, that are integral to printed wiring boards. It is also known to use electrophoresis to deposit non-photoactive thermally curable coatings. Electrodeposition of photosensitive coatings by anaphoresis is disclosed in U.S. Pat. No. 3,738,835.

U.S. Pat. No. 4,845,012 discloses photocurable electrodeposition coating compositions for printed circuit photoresist film comprising a water-soluble or water-dispersible polymerizable unsaturated polymer having an acid value of 20 to 300, an unsaturation equivalent of 150 to 3000 and a number average molecular weight of not less than 300, a water-insoluble polymerizable initiator, and a chelating agent. β-diketone is listed as an example of a chelating agent.

Existing anodic electrodeposited resists suffer from poor alkaline etch survivability. The exposed resist patterns tend to be attacked by pH 8-9 ammoniated cupric chloride etch solutions commonly used in the printed wiring board (PWB) industry to etch wiring patterns in a copper clad PWB substrate. A need exists for an additive which when added to electrodeposition resist emulsion formulations improves alkaline etch resistance, without destabilizing the emulsion or having a deleterious effect on the coating quality. Tack characteristics of the electrodeposited resist coating also need improvement.

U.S. Pat. No. 4,943,513 discloses the addition of multivalent metal chelate salts of weakly acidic organic compounds along with other anionic organic or inorganic groups to dry film photoresist formulations to reduce cold flow.

Ionizable materials such as metal salts are known to adversely affect electrodeposited coating quality. Evidence of this is found on page 8 of Electrodeposition And Radiation Curing Of Coatings, by M. W. Ranney, Noyes Data Corporation, 1970 and U.S. Pat. No. 3,444,064.

Surprisingly and unexpectedly, addition of specific metal salts of β-diketones, of the structure shown below, to electrodeposition resist emulsion formulations can lead to a coating with improved alkaline etch resistance, without destabilizing the emulsion or having a deleterious effect on the coating quality. Also, such electrodeposited resist coating can result in reduced tack.

SUMMARY OF THE INVENTION

The present invention is directed to a process for electrodepositing a coating film on an electroconductive article which comprises the following steps:

immersing the electroconductive article in a photoimageable electrodeposition coating composition comprising an aqueous dispersion of (a) a water-soluble or water-dispersible polymer having an acid value of 20 to 300, and a number average molecular weight of not less than 300; with the proviso that when the polymer is unsaturated it has an unsaturation equivalent of 150 to 3000, and when the polymer is saturated it is used in combination with an ethylenically unsaturated compound;

(b) an initiator or initiating system, and (c) a metal salt of a β diketone having the following general formula:

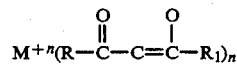

wherein

M is a metal cation selected from the group consisting of $Al^{+3}$, $Ca^{+2}$, $Ni^{+2}$, $Cr^{+3}$, $Mg^{+2}$ and $Fe^{+3}$;

R and $R_1$ independently are alkyl of 1 to 18 carbon atoms or aryl of 6 to 30 carbon atoms, n is the valency of the metal; and forming an electrodeposition coated film on the surface of the electroconductive article by supplying electric current to the article as the anode.

DETAILED DESCRIPTION OF THE INVENTION

The present invention covers a process for electrodepositing a coating film on an electroconductive article which comprises the steps of immersing the electroconductive article in a photoimageable electrodeposition coating composition, followed by forming an electrodeposition coating film on the surface of the electroconductive article by supplying electric current to the article as the anode. It will how be described in detail with particular reference to preferred embodiments.

WATER-SOLUBLE OR WATER-DISPERSIBLE POLYMERIZABLE UNSATURATED POLYMER

The polymerizable unsaturated polymer (a) used in this invention is a polymer containing at least one radical polymerizable unsaturated bond in a polymer main chain or side chain. The polymerizable unsaturated polymer (a) can typically be selected from the group of the following polymers (1)–(5).

(1) A polymerizable unsaturated polymer obtained by adding an equimolar addition product of a hydroxyl group-containing unsaturated compound and a diisocyanate compound to a hydroxyl group-containing acrylic polymer having a high acid value;

(2) A mixture of a polymerizable unsaturated polymer obtained by adding an α, β-ethylenically unsaturated dibasic acid or its anhydride to an unsaturated bond of an aliphiatic acid chain in an ester of an epoxy polymer and an unsaturated aliphatic acid, and an ethylenically unsaturated compound. The epoxy polymer is a compound having a relatively high molecular weight and containing at least one epoxy group in one molecule;

(3) A mixture of a polymerizable unsaturated polymer composed of an unsaturated aliphatic acid modified alkyd polymer having a high acid value and an ethylenically unsaturated compound;

(4) A mixture of a polymerizable unsaturated polymer composed of a maleinized oil and an ethylenically unsaturated compound; and (5) A polymerizable unsaturated polymer obtained by adding a glycidyl group-containing unsaturated compound to an acrylic polymer having a high acid value.

Of these polymerizable, unsaturated polymers, the polymer (5) is preferred.

The polymerizable unsaturated polymer (a) is described in more detail in U.S. Pat. No. 4,845,012 issued Jul. 4, 1989.

It is advantageous that the foregoing polymerizable unsaturated polymers have a glass transition temperature (Tg) of 0° to 100° C., preferably 20° to 70° C. in addition to said acid value, unsaturation equivalent and number-average molecular weight.

Where Tg of the polymerizable unsaturated polymer is less than 0° C., the electrodeposition coated film can be tacky, and dust or other impurities tend to adhere to the coated film or the coated film is hard to treat. Where Tg exceeds 100° C., the electrodeposition coated film can be hard and susceptible to crack formation.

The polymerizable unsaturated polymers in this invention are water-dispersible or water-soluble, and the water dispersion or water solubilization is carried out by neutralizing the acid group, e.g. a carboxylic acid group, contained in the skeleton of the polymerizable unsaturated polymer with an alkali (neutralizing agent). Examples of the neutralizing agent include alkanolamines such as monoethanolamine, diethanolamine and triethanolamine; alkylamines such as triethylamine, diethylamine, monoethylamine, diisopropylamine, trimethylamine and diisobutylamine; alkylalkanolamines such as dimethylaminoethanol; alicyclic amines such as cyclohexylamine; alkali metal hydroxides such as sodium hydroxide and potassium hydroxide; and ammonia. These may be used either singly or as a mixture of two or more. The amount of the neutralizing agent is preferably 0.3 to 1.0 equivalent per mol of the acid group contained in the skeleton of the polymer. Where the amount is less than 0.3 equivalent, water dispersibility decreases and this makes electrodeposition difficult. Where the amount is more than 1.0 equivalent, storage stability tends to decrease.

WATER-SOLUBLE OR WATER-DISPERSIBLE SATURATED POLYMER

Saturated polymers for use in the photosensitive polymer composition of the invention typically are addition or condensation polymers having carrier groups. Addition polymers having carrier groups prepared from monomers having ethylenic unsaturation are preferred. Carrier group is defined as a moeity attached to the polymer which is capable of being charged positively or negatively. Polymers containing carrier groups that are useful in the photosensitive polymer composition include acrylic polymers, vinyl polymers other than acrylic polymers, epoxy polymers, polyurethanes, polyesters, and polyamides. Negatively charged carrier groups or anaphoretic carrier groups, include, groups which become negatively charged upon reaction with a base, for example, carboxylic acid groups. Bases which are useful to ionize these carrier groups include ammonia, triethylamine, hydroxyethylamine, and the like.

Positively charged carrier groups, or cataphoretic carrier groups, include groups which become positively charged upon reaction with acid, for example, amines. The acids that are useful to protonate the carrier groups include lactic acid, hydrochloric acid, acetic acid and phosphoric acid.

Acrylic polymers containing carrier groups are prepared by the polymerization or copolymerization of acrylic acid, methacrylic acid, the esters or amides thereof, and mixtures of such monomers, provided that at least one such monomer contains a carrier group. An acrylic polymer bearing cataphoretic carrier groups can be prepared by the polymerization of monomers, one of which has a basic amine group, such as 2-(dimethylamino)ethyl methacrylate (DMAEMA), or 3-(dimethylamino) propyl methacrylamide (DMAPMA). Upon reaction with an acid, such as, for example, lactic acid, the amine groups on the polymer are converted to positively charged amine salts. Similarly, (meth) acrylic acid polymers bearing anaphoretic carrier groups may be prepared from acrylic acid or methacrylic acid monomers alone or with other monomers such as lower alkyl acrylic or methacrylic acid esters where the alkyl group contains from one to about eight carbon atoms, for example, methyl methacrylate, butylacrylate, and the like. The pendant carboxylic acids on the poly(meth) acrylic acid polymers are then converted to the negatively charged carboxylate salts by reaction with a base, such as, for example, triethylamine.

Alternatively, it is also possible to modify polymers having no carrier groups to incorporate such carrier groups. For example, a glycidyl methacrylate polymer can be reacted with an amine to attach amine carrier groups to the polymer chain.

vinyl polymers, other than the acrylic or methacrylic polymers described above, incorporating carrier groups may also be used. These polymers can be prepared by the polymerization of vinyl monomers such as styrene and substituted styrene, vinyl halides such as vinyl chloride, vinyl esters such as vinyl acetate, and vinyl ethers such as methyl vinyl ether, alone or with other vinyl monomers containing carrier groups such as 2-methylvinylimidazole and vinyl imidazole containing cataphoretic carrier groups.

It is also possible to prepare polymers that are suitable for the practice of this invention from the polymerization of the acrylic and methacrylic monomers together with the other vinyl monomers, provided that at least one of the monomers contains a carrier group.

A preferred class of polymers suitable for anaphoresis are prepared by the free radical polymerization in a suitable solvent of esters and/or amides of acrylic acid and/or methacrylic acid, where at least one of the monomers contains a carboxylic acid carrier group. Suitable solvents for the polymerization include the monopropyl ethers of 1,2-propanediol (such as Propasol ®-P manufactured by Union Carbide Corporation), methyl cellosolve, ethyl cellosolve, butyl cellosolve, cellosolve acetate, methyl carbitol, butyl carbitol, 1,2-dimethoxyethane, diethylene glycol dimethyl ether, isopropanol, propanol, n-butanol, sec-butanol, isobutanol, cyclohexanol, ethylene glycol, 1,3-propanediol, acetone, methyl ethyl ketone, methyl isobutyl ketone, tetrahydrofuran, ethyl acetate, butyl acetate, 1,4-dioxane, toluene, xylene, acetonitrile, dimethylformamide and dimethylsulfoxide.

The polymer or polymer mixture containing the carrier groups typically contains from at least about 10 milliequivalents of charged carrier group per 100 grams of the polymer or polymer mixture (in order for the polymer or polymer mixture to be water dispersible and capable of being electrophoretically depositable as a film) to less than about 200 milliequivalents of charged carrier group per 100 grams of polymer or mixture (in order for the electrophoretically deposited film to be capable of being selectively developed without adversely affecting the exposed areas of the film). The milliequivalents of charged carrier group per 100 grams of polymer (meq/100 g) is calculated based on the assumption that each equivalent of base added in the case of an anaphoretic carrier group, has ionized one equivalent of carrier group, such as carboxylic acid, on the polymer.

In the case of the anaphoretic polymers containing negatively charged carrier groups, it is preferred that the polymer contain from about 20 to 100 meq/100 g.

The molecular weight of the polymers used in the photosensitive polymer composition of the invention typically is less than 100,000 weight average molecular weight. When acrylic, methacrylic, or the other vinyl polymers containing carrier groups are used, the weight average molecular weight should range from about 10,000 to about 100,000, and preferably from about 20,000 to about 60,000 weight average molecular weight.

One particularly preferred anaphoretic polymer mixture useful in the photosensitive polymer composition of the invention is formed from about six to about 15 weight percent acrylic acid, about 17 to about 60 weight percent ethyl acrylate, and from about 77 to about 25 weight percent methyl methacrylate. These copolymers have a molecular weight of from about 10,000 to about 100,000 and a glass transition temperature of from about 30° C. to about 80° C. When this polymer mixture is formulated as an aqueous emulsion with a crosslinking unsaturated monomer, a photoinitiator, a metal salt of the type described in this patent, and a base, to ionize the carrier groups, the anaphoretically deposited adherent film formed on a conductive substrate surface is easily developed with an aqueous solution of a strong base, and the exposed areas of the film are resistant to strong inorganic acid solutions and weak aqueous bases.

ETHYLENICALLY UNSATURATED COMPOUND

The saturated polymers described earlier may be used in combination with at least one ethylenically unsaturated compound; also, the unsaturated polymer may be employed with the unsaturated compound. Preferred compounds are unsaturated or polyunsaturated meth(acrylic) monomers such as (meth)acrylic acid alkyl (C1–18) esters such as methyl (meth) acrylate, ethyl (meth) acrylate, butyl (meth)acrylate and octyl (meth) acrylate; vinyl aromatic compounds such as styrene, vinyltoluene and vinylbenzene; and oligomers such as diethylene glycol di(meth)acrylate, polyethylene glycol di(meth)acrylate, 1,4-butanediol di-(meth) acrylate and pentaerythritol tri(meth) acrylate.

The amount of the ethylenically unsaturated compound used as an optional component with the polymerizable unsaturated polymers (1)–(5) or as an essential component with the saturated polymers is not strictly limited but can vary with its type or the type of the polymerizable unsaturated or saturated polymer. It is usually not more than 100 parts by weight, preferably 1 to 50 parts by weight per 100 parts by weight of the polymerizable unsaturated or saturated polymer.

INITIATOR

The photopolymerization initiator used in the composition of this invention typically is any photopolymerization initiator commonly used. It is preferably water-insoluble. Some suitable photopolymerization initiators are disclosed in U.S. Pat. No. 4,845,012 issued Jul. 4, 1989. The amount of the photopolymerization initiator varies depending on its type or desired curing rate. It is generally 0.1 to 15 parts by weight, preferably 2 to 10 parts, and still more preferably 2 to 8 parts by weight per 100 parts by weight of the polymerizable unsaturated or saturated polymer component.

METAL SALT OF A $\beta$-DIKETONE

The metal salt of the $\beta$-diketone has the formula described above.

Some suitable metal salts of $\beta$-diketones include: calcium acetylacetonate, aluminum acetylacetonate, ferric acetylacetonate, aluminum octadecanoylacetonate, aluminum benzoylacetonate, calcium octadecanoylacetonate, calcium benzoylacetonate, nickel acetylacetonate, chromium acetylacetonate, aluminum octanoylacetonate, calcium octanoylacetonate, aluminum dodecanoylacetonate, calcium dodecanoylacetonate, nickel benzoylacetonate, chromium benzoylacetonate, aluminum p-methoxybenzoylacetonate, aluminum trifluoroacetylacetonate, aluminum hexafluoroacetylacetonate, magnesium acetylacetonate.

The metal salt typically is present in the amount of 0.1 to 10 parts by weight, preferably 1 to 5 parts by weight per 100 parts by weight of the polymerizable unsaturated or saturated polymer component.

ADDITIVES

The photocurable electrodeposition coating composition in this invention can contain an ordinary polymer binder such as a polymerizable unsaturated group-containing polymer other than the aforesaid polymerizable unsaturated polymer or a saturated polymer. Examples of the polymerizable unsaturated group-containing polymer include those obtained by introducing ethylenically unsaturated groups into polymers, such as a polyester acrylate polymer, a polyurethane polymer, an epoxy polymer and an acrylic polymer. Examples of the saturated polymers include a polyester polymer, a polyurethane polymer, an epoxy polymer and an acrylic polymer. Where the additional polymer binder is used, it is typically blended in an amount of not more than 100 parts by weight, preferably 1 to 50 parts by weight per 100 parts by weight of the polymerizable unsaturated or saturated polymer so as to properly adjust properties of the coated film.

The photocurable electrodeposition coating composition in this invention can contain surface-active agents, such as polyoxyethylene alkyl phenols, polyoxyethylenes, polyoxypropylenes, polyoxybutylenes, or combinations of these; anionic or cationic surfactants, fluorinated surfactants, etc.

The polymerizable unsaturated or saturated polymer water solubilized or water-dispersed by neutralization may optionally be mixed with a hydrophilic solvent to improve the flowability of the polymer component. Examples of the hydrophilic solvent include alcohols such as isopropanol, n-butanol, t-butanol, methoxyethanol, ethoxyethanol, butoxyethanol and diethylene glycol; and ethers such as methyl ether, dioxane and tetrahydrofuran. When the hydrophilic solvent is used, the amount thereof is generally not more than 300 parts by weight, preferably 1 to 100 parts by weight per 100 parts by weight of the polymer component.

Also, in order to increase the amount of the coating on the material to be coated, a hydrophobic solvent can optionally be added also to the water-solubilized or water-dispersed polymerizable unsaturated or saturated polymer. Examples of the hydrophobic solvent include petroleum solvents such as toluene and xylene; ketones such as methyl ethyl ketone and methyl isobutyl ketone; esters such as ethyl acetate and butyl acetate; higher alcohols such as 2-ethylhexyl alcohol and cyclohexanol. The amount of the hydrophobic solvent is generally not more than 200 parts by weight, preferably 1 to 100 parts by weight per 100 parts by weight of the polymer component.

The electrodeposition resist coating composition may also contain dyes known to those skilled in the art. Some preferred dyes include Sudan® Blue 670, Sudan® Red, etc.

PROCESS

The electrodeposition coating is applied to the printed circuit substrate using the photocurable electrodeposition coating composition in the following manner. An electrodeposition coating bath containing as main components the polymerizable unsaturated or saturated polymer, water solubilized or water dispersed by neutralization as above, the photopolymerization initiator and the metal salt of the $\beta$-diketone and optionally the ethylenically unsaturated compound may be controlled at a pH of 6.5 to 9. The bath concentration is typically maintained at 3 to 25% by weight based on nonvolatiles, preferably 10 to 20% by weight, and at a temperature of 15° to 40° C., preferably 15° to 30° C. A substrate such as a copper clad epoxy glass substrate functioning as an anode is dipped into the photocurable electrodeposition coating composition, and a DC electric current of 40 to 400 V is passed. The length of time for the passage of current is typically 15 seconds to 5 minutes resulting in a coating which upon drying has a thickness of 3 to 100$\mu$, preferably 5 to 25$\mu$.

The electrodeposited coating is drawn up from the electrodeposition coating bath and can be washed with water. The coating is then dried using conventional heating means such as hot air, etc.

Subsequently the uncured, electrodeposition coated film is imaged through a target and the unexposed areas washed away using techniques known to those skilled in the art. The board can be etched using conventional techniques to give a printed circuit on the substrate.

The following examples, wherein the parts and percentages are by weight, illustrate but do not limit the invention.

Polymer Synthesis Example 1

A mixture comprising 62 parts by weight of methyl methacrylate, 33 parts by weight acrylic acid, 5 parts by weight methacrylic acid, and 5.5 parts by weight of 2,2'-azobis (2-methylbutyronitrile) was added dropwise to 48 parts by weight of propylene glycol monomethyl ether and 16 parts by weight cyclohexanol hold at 115° C. under an atmosphere of nitrogen gas over the course of 3 hours. 2 parts propylene glycol monomethyl ether was used as a wash to clean the addition vessel, and added to the mixture. After the addition, the mixture was held for 0.5 hour. A mixture comprising 0.5 part by weight of 2,2'-azobis(2-methyl-butyronitrile) and 2 parts by weight of propylene glycol monomethyl ether was added dropwise over the course of 1 hour, and the solution was further aged for 7 hours at 110° C. to obtain an acrylic resin. To the solution were then added 0.15 parts di-t-butylhydroxytoluene, and 0.6 parts tetraethylammonium bromide. 50 parts by weight of glycidyl methacrylate was then added over 1.5 hours at 108° C. while air was blown in. While continuing air addition, the reaction was performed at 108° C. for 3 hours to obtain a solution of a polymerizable unsaturated resin (acid value about 62, unsaturation equivalent about 2.3 moles/kg., and number average molecular weight of 2600). % nonvolatiles was reduced to 62 by adding 26 parts deionized water.

Resist Formulation Example 1

Five batches of electrodeposited resist emulsions were prepared, using the following formulations and procedure.

| Batch Ingredient | 1 | 2 | 3 | 4 | 5 |
|---|---|---|---|---|---|
| | Quantity, grams | | | | |
| Polymer solution from Procedure 1 | 160.5 | 160.5 | 160.5 | 160.5 | 160.5 |
| Ciba-Geigy Irgacure ®-907 initiator | 4 | 4 | 4 | 4 | 4 |
| Isopropyl thioxanthone | 2 | 2 | 2 | 2 | 2 |
| OCl-hexaarylbi-imidazole dimer | 1 | 1 | 1 | 1 | 1 |
| BASF Lucirin ® TPO initiator | 2 | 2 | 2 | 2 | 2 |
| Leuco crystal violet | 0.25 | 0.25 | 0.25 | 0.25 | 0.25 |
| Methylbenzo-triazole | 0.2 | 0.2 | 0.2 | 0.2 | 0.2 |
| Polyoxyethylene nonylphenol surfactant | 1 | 1 | 1 | 1 | 1 |
| BASF Sudan ® Blue 670 dye | 0.13 | 0.13 | 0.13 | 0.13 | 0.13 |
| Metal salt* | 2 | 2 | 2 | 0 | 2 |
| Sartomer ® CD-492 monomer | 15 | 15 | 15 | 15 | 15 |
| Cyclohexanol | 20 | 20 | 20 | 20 | 20 |
| Propylene glycol monomethyl ether | 10 | 10 | 10 | 10 | 10 |
| Triethylamine | 7.3 | 7.3 | 7.3 | 7.3 | 7.3 |
| Distilled water | 600 | 600 | 600 | 600 | 600 |

*The following metal salts were used:
Batch   Salt
1)   Al Acetylacetonate (Alacac)
2)   Fe Acetylacetonate (Feacac)
3)   Mg Acetylacetonate (Mgacac)
4)   None

| Batch<br>Ingredient | 1 | 2 | 3 | 4 | 5 |
|---|---|---|---|---|---|
| | | | Quantity, grams | | |
| 5) Magnesium Stearate | | | | | 5 |

Polymer solution from Procedure 1 was weighed out in 1000 ml jar. The next twelve ingredients were weighed out and mixed at 40°–50° C. in 100 ml beaker to form a solution. This solution was added to the polymer solution from Procedure 1 slowly over 2 min with stirring, using a paddle stirrer. The mixture was stirred 1 hr at 400 rpm, using an ice water bath to keep it cool. Triethylamine was added slowly to the solution with stirring (2–3 drops/sec), and stirred 1 hr. Water was added slowly (2–3 drops/sec) with dropping funnel. Stirring speed was increased to 800 rpm after about 50 ml water was added. After all water was added to form an emulsion, the emulsion was stirred another 10 min.

Batches 1–4 gave uniform emulsions, with no precipitates. Batch 5 gave an emulsion, but some precipitate was noted. This was filtered out before electrodeposition.

One ounce copper-clad laminate panels were prepared for coating by scrubbing with 320 grit brushes in a Chemcut scrubber. The emulsion was electrodeposited to form a resist at 60 ma/dm$^2$ for 3 minutes on the panels in a polyethylene cell approximately 4 inches (10.16 cm) wide, 2 inches (5.08 cm) deep, and 8 inches (20.32 cm) high. A stainless steel cathode approximately 4 inches (10.16 cm) wide by 8 inches (20.32 cm) high was used as counterelectrode to the laminate. Electrical power was supplied by a Hewlett Packard 6035A DC power supply. After electrodeposition, panels were spray-rinsed with water for 30–40 seconds, excess water was removed by air-blowing, and residual moisture removed by drying at 90° C. for 600 seconds. Coating thickness was measured as follows.

| Batch # | Thickness, microns |
|---|---|
| 1) | 12.45 |
| 2) | 10.16 |
| 3) | 7.6 |
| 4) | 9.65 |
| 5) | 7.87 |

Coatings from batches 1–4 were uniform and shiny. Coatings from batch 5 had orange peel, dark spots, and streaks. Adding 1% hydrophobic solvent cyclohexanol to the emulsion reduced orange peel and increased thickness in batch 5 coatings, but coatings were still not shiny.

Coated samples were tested for tack by rating empirically the force required to peel a phototool from the resist panel after exposure in a Mimir 9224 UV exposure unit. Exposure energy in mj/cm$^2$ was measured using an International Light model 1400A radiometer with an XRL 1140B detector. Samples were tested on 2 separate days. On day one, with 84° F. (28.9° C.) room temperature and 48–50% relative humidity, tack ratings of coatings from batches 1, 2, and 4 vs. mj/cm$^2$ exposure were as shown in Table I. The Fe and Al Acac salt-containing coatings had lower tack than the coating with no metal salts. On day two, with 81°–82° F. (27.2°–27.8° C.) room temperature and 39–40 % relative humidity, tack ratings of coatings from batches 1, 3, and 5 vs. mj/cm$^2$ exposure were as shown in Table II. The coatings ranked: lowest tack=Al Acac<Mg Acac<Mg Stearate. Tack values of batch 1 were probably lower on day 2 than on day 1 because the temperature and humidity were lower on day 2.

TABLE I

| | Day 1 Tack | | |
|---|---|---|---|
| | Exposure, mj/cm$^2$ | | |
| Batch # | 50 | 100 | 150 |
| 1 | 4 | 4 | 5 |
| 2 | 3 | 4 | 4 |
| 4 | 5 | 5 | 6 |

TABLE II

| | Day 2 Tack | | |
|---|---|---|---|
| | Exposure, mj/cm$^2$ | | |
| Batch # | 50 | 100 | 150 |
| 1 | 3 | 3 | 3 |
| 3 | 3 | 3 | 4 |
| 5 | 3 | 4 | 4 |

Resist Formulation Example 2

This example shows improved resistance to alkaline ammoniacal solutions.

The two formulations below were prepared and electrodeposited following the procedures in Resist Formulation Example 1, yielding coatings approximately 0.7 mils (18 microns) thick. These were exposed to UV through a 5 mil (127 micron) line and space phototool over a range of exposure energies in a Mimir 9224 exposure unit. Exposure response was monitored using a 2 step wedge. Unexposed resist was removed by spraying with 0.75% Na$_2$CO$_3$ in a conveyorized ASI 757 developer for 2 times the time it took to just wash off all the unexposed resist from the copper surface. Samples were dipped for a range of times in room temperature 1 molar NH$_4$Cl solution adjusted to pH 9.65 with 28% NH$_4$OH. After dipping, they were rinsed with water, and air-blown dry. This process simulates the low ionic strength replenishment rinse used in alkaline etching machines. The time the resist lines survived vs. exposure was noted, and is shown in Table III. Whereas increasing exposure increased survival time in both cases, the resist containing Alacac survived significantly longer than the one without.

| Batch #<br>Ingredient | 1 | 2 |
|---|---|---|
| | Quantity, grams | |
| Polymer solution from Example 1 | 167 | 167 |
| Ciba Geigy Irgacure ®-907 initiator | 4 | 4 |
| Isopropyl thioxanthone | 2 | 2 |
| OCl-hexaarylbi-imidazole dimer | 1 | 1 |
| BASF Lucirin ® TPO initiator | 2 | 2 |
| Leuco crystal violet | 0.25 | 0.25 |
| Methylbenzo-triazole | 0.2 | 0.2 |
| Polyoxyethylenne nonylphenol surfactant | 1 | 1 |
| BASF Sudan ® Blue 670 dye | 0.13 | 0.13 |

-continued

| Batch # | 1 | 2 |
|---|---|---|
| Ingredient | Quantity, grams | |
| Alacac | 0 | 2 |
| Sartomer ® CD 492 monomer | 15 | 15 |
| Benzyl alcohol | 16 | 20 |
| Cyclohexanol | 10 | 10 |
| Triethyl amine | 8.2 | 8.2 |
| Distilled water | 600 | 600 |

TABLE III

| | Alkaline dip survival, seconds | | | | |
|---|---|---|---|---|---|
| | √ 2 Step Held | | | | |
| Batch # | 6 | 7 | 9 | 10 | 12 |
| no Alacac | | 28 | | 57 | 51 |
| 2 parts/100 parts polymer | 34 | | | | 91 |

Resist Formulation Example 3

This example shows improved resistance to alkaline ammoniacal solutions.

Four formulations were prepared per methods in Resist Formulation Example 1 with identical composition, except for Alacac level, as shown below. Alacac at 1, 2, 3, and 4 parts per 100 parts polymer was, tested. The four were electrodeposited on 1 ounce copper-clad laminate for 3 min at 60 mA/dm$^2$, yielding coatings approximately 0.6 mils thick. These were exposed, developed and tested in pH 9.65 solution following the procedures in Example 2. The time the resist lines survived vs. exposure is shown in Table IV. While there is variation in the data, the trend to longer survival with higher Alacac is evident.

| Batch # | 1 | 2 | 3 | 4 |
|---|---|---|---|---|
| Ingredient | Quantity, grams | | | |
| Polymer solution from Example 1 | 167 | 167 | 167 | 167 |
| Ciba Geigy Irgacure ®-907 initiator | 4 | 4 | 4 | 4 |
| Isopropyl thioxanthone | 2 | 2 | 2 | 2 |
| OCl-hexaarylbi-imidazole dimer | 1 | 1 | 1 | 1 |
| BASF Lucirin ® TPO initiator | 2 | 2 | 2 | 2 |
| Leuco crystal violet | 0.25 | 0.25 | 0.25 | 0.25 |
| Methylbenzo-triazole | 0.2 | 0.2 | 0.2 | 0.2 |
| Polyoxyethylene nonyl phenol surfactant | 1 | 1 | 1 | 1 |
| BASF Sudan ® Blue 670 dye | 0.13 | 0.13 | 0.13 | 0.13 |
| Alacac | 1 | 2 | 3 | 4 |
| Sartomer ® 480 monomer | 15 | 15 | 15 | 15 |
| Benzyl alcohol | 16 | 16 | 16 | 16 |
| Cyclohexanol | 4 | 4 | 4 | 4 |
| Propylene glycol monomethyl ether | 10 | 10 | 10 | 10 |
| Triethylamine | 7.2 | 7.2 | 7.2 | 7.2 |
| Distilled water | 600 | 600 | 600 | 600 |

TABLE IV

| | Alkaline dip survival, seconds | | | | | | |
|---|---|---|---|---|---|---|---|
| | √ 2 Step Held | | | | | | |
| Batch # | 7 | 8 | 9 | 10 | 11 | 12 | 13 |
| 1 | | 62 | 77 | | 77 | 119 | 106 |
| 2 | 63 | 51 | 64 | | 71 | 100 | |
| 3 | 81 | 68 | 110 | | 119 | 128 | |
| 4 | 109 | 83 | 103 | 119 | 138 | 139 | 141 |

Resist Formulation Example 4

Composition with no polyunsaturated monomer

The four formulations below were prepared using the polymer in Polymer synthesis Example 1, and following the procedure in Resist Formulation Example 2, to show polyunsaturated monomer need not be present for good resist performance in alkaline etching.

| Batch # | 1 | 2 | 3 | 4 |
|---|---|---|---|---|
| Ingredient | Quantity, grams | | | |
| Polymer solution | 160.5 | 160.5 | 160.5 | 160.5 |
| Ciba Geigy Irgacure ®-907 initiator | 4 | 4 | 4 | 4 |
| Isopropylthio-xanthone | 2 | 2 | 2 | 2 |
| OCl-hexaarylbi-imidazole dimer | 1 | 1 | 1 | 1 |
| BASF Lucirin ® TPO initiator | 2 | 2 | 2 | 2 |
| Leuco crystal violet | 0.25 | 0.25 | 0.25 | 0.25 |
| Methylbenzo-triazole | 0.2 | 0.2 | 0.2 | 0.2 |
| Polyoxyethylene nonyl phenol surfactant | 1 | 1 | 1 | 1 |
| BASF Sudan ® Blue 670 dye | 0.13 | 0.13 | 0.13 | 0.13 |
| Alacac | 3 | 3 | 3 | 3 |
| Sartomer ® 492 monomer* | 8 | 5 | 2.5 | 0 |
| Cyclohexanol | 20 | 20 | 20 | 20 |
| Propylene glycol monomethyl ether | 10 | 10 | 10 | 10 |
| Triethylamine | 7.3 | 7.3 | 7.3 | 7.3 |
| Dist. water | 591 | 574 | 560 | 546 |

*polyfunctional unsaturated monomer

The four formulations were electrodeposited on 1 ounce copper-clad laminate for 3 min at 60 mA/dm$^2$, yielding coatings approximately 0.6 mils (15.2 microns) thick. These were exposed, developed and tested in pH 9.65 solution following the procedures in Resist Formulation Example 3. The time the resist lines survived in the alkaline etch test vs. exposure energy in mj/cm$^2$ is shown in Table V.

TABLE V

| Exposure Energy vs. Etch Test Survival Time, seconds. | | | | |
|---|---|---|---|---|
| Exposure, mj/cm$^2$ | 5-1 | 5-2 | 5-3 | 5-4 |
| 50 | 22 | 13 | 22 | 23 |
| 100 | 39 | 34 | 33 | 35 |
| 200 | 60 | 62 | 54 | 60 |

Regardless of monomer level, all four survived to about the same degree vs. exposure energy.

Resist Formulation Example 6

The two formulations below were prepared using the polymer in Polymer Synthesis Example 1, and following the procedure in Resist Formulation Example 2, to show the importance of the metal cation for good resist performance in alkaline etching.

| Batch # | 6-1 | 6-2 |
|---|---|---|
| Ingredient | Quantity, grams | |
| Polymer solution | 160.5 | 160.5 |
| Ciba Geigy Irgacure ®-907 initiator | 4 | 4 |
| Isopropylthioxanthone | 2 | 2 |
| OCl-hexaarylbiimidazole dimer | 1 | 1 |
| BASF Lucirin ® TPO initiator | 2 | 2 |
| Leuco crystal violet | 0.25 | 0.25 |
| Methylbenzotriazole | 0.2 | 0.2 |
| Polyoxyethylene nonyl phenol surfactant | 1 | 1 |
| BASF Sudan ® Blue 670 dye | 0.13 | 0.13 |
| Alacac | 3 | 0 |
| Acac[1] | 0 | 2.75 |
| Sartomer ® 492 monomer | 10 | 10 |
| Cyclohexanol | 20 | 20 |
| Propylene glycol monomethyl ether | 10 | 10 |
| Triethylamine | 5.5 | 5.5 |
| Dist. water | 600 | 600 |

[1] is acetylacetone

Each formulation was electrodeposited on 1 ounce copper-clad laminates for 3 min at 60 mA/dm$^2$, yielding coatings approximately 0.6 mils (1.524 microns) thick. These were exposed, developed and tested in pH 9.65 solution following the procedures in Example 3. The time the resist lines survived in the alkaline etch test vs. exposure energy in mj/cm$^2$ is shown in Table VI.

TABLE VI

| Exposure Energy vs, Etch Test Survival Time, secs. | | |
|---|---|---|
| Batch # | | |
| 6-1 | 6-2 | |
| Survival Time, secs. | | Exposure, mj/cm$^2$ |
| 74.000 | 64.750 | 50.000 |
| 99.437 | 76.312 | 100.00 |
| 152.62 | 129.50 | 200.00 |
| 50.875 | — | 25.000 |
| 83.250 | 69.375 | 70.000 |
| 124.88 | — | 140.00 |
| — | 90.188 | 120.00 |
| — | 136.44 | 205.00 |

Batch #6-1 survives 15–20% longer than Batch #6-2.

What is claimed:

1. A process for electrodepositing a coating on an electroconductive article which comprises the following steps:
    immersing the electroconductive article in a photoimageable electrodeposition coating composition comprising an aqueous dispersion of
    (a) a water-soluble or water-dispersible polymer having an acid value of 20 to 300, and a number average molecular weight of not less than 300; with the proviso that when the polymer is unsaturated it has an unsaturation equivalent of 150 to 3000, and when the polymer is saturated, it is used in combination with an ethylenically unsaturated compound;
    (b) an initiator or initiating system, and
    (c) a metal salt of a β diketone having the following general formula:

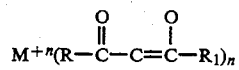

wherein
    M is a metal cation selected from the group consisting of $Al^{+3}$, $Ca^{+2}$, $Ni^{+2}$, $Cr^{+3}$, $Mg^{+2}$ and $Fe^{+3}$;
    R and $R_1$ independently are alkyl of 1 to 18 carbon atoms or aryl of 6 to 30 carbon atoms;
    n is the valency of the metal; and
    forming an electrodeposition coated film on the surface of the electroconductive article by supplying electric current to the article as the anode.

2. The process of claim 1 wherein the water-soluble or water-dispersible polymerizable unsaturated polymer is further used in combination with an ethylenically unsaturated compound.

3. The process of claim 2 wherein the ethylenically unsaturated compound is an unsaturated or polyunsaturated monomer.

4. The process of claim 1 wherein the β diketone is present in the amount of 0.1 to 10 parts by weight per 100 parts by weight of the water-soluble or water-dispersible polymer.

5. The process of claim 4 wherein the β diketone is present in the amount of 1 to 5 parts by weight per 100 parts by weight of the water-soluble or water-dispersible polymer.

6. The process of claim 1 wherein the β diketone is aluminum acetylacetonate.

7. The process of claim 1 wherein the β diketone is iron acetylacetonate.

8. The process of claim 1 wherein the β diketone is magnesium acetylacetonate.

9. The process of claim 1 wherein the water-soluble or water-dispersible polymerizable unsaturated polymer has an acid value of 50 to 70.

10. The process of claim 1 wherein the water-soluble or water-dispersible polymer is unsaturated.

11. The process of claim 1 wherein the water-soluble or water-dispersible polymerizable unsaturated polymer has a number average molecular weight of not less than 1000.

12. The process of claim 1 wherein the water-soluble or water-dispersible polymerizable unsaturated polymer has a glass transition temperature of 0° to 100° C.

13. The process of claim 1 wherein the initiator is present in the amount of 0.1 to 15 parts by weight per 100 parts by weight of the water-soluble or water-dispersible polymer.

14. The process of claim 1 wherein the concentration of the photoimageable electrodeposition coating composition is 3 to 25% by weight based on nonvolatiles.

15. The process of claim 14 wherein the concentration of the photoimageable electrodeposition coating composition is 10 to 20% by weight based on nonvolatiles.

16. The process of claim 1 wherein the photoimageable electrodeposition coating composition is maintained at a temperature of 15° to 40° C.

17. The process of claim 1 wherein electric current to the article is supplied for 15 seconds to 5 minutes.

18. The process of claim 1 wherein the coating has a thickness of 3 to 100μ.

19. The process of claim 18 wherein the coating has a thickness of 5 to 25μ.

* * * * *